United States Patent [19]

Ashley

[11] 4,087,762

[45] May 2, 1978

[54] CABLE EQUALIZATION RESONANT AMPLIFIER CIRCUIT

[75] Inventor: Albert H. Ashley, Holliston, Mass.

[73] Assignee: GTE Sylvania Incorporated, Stamford, Conn.

[21] Appl. No.: 812,183

[22] Filed: Jul. 1, 1977

[51] Int. Cl.$^2$ .......................... H03F 3/04; H03H 5/00
[52] U.S. Cl. ..................................... 330/304; 330/53; 330/294; 330/302; 330/306; 333/28 R
[58] Field of Search .................. 330/53, 94, 294, 296, 330/302, 304, 306; 333/28 R

[56] References Cited

U.S. PATENT DOCUMENTS

| | | | |
|---|---|---|---|
| 3,341,786 | 9/1967 | Stull, Jr. | 330/53 X |
| 3,456,206 | 7/1969 | Kwartiroff et al. | 330/304 |
| 3,581,122 | 5/1971 | Gaunt, Jr. | 330/94 X |

*Primary Examiner*—Lawrence J. Dahl

*Attorney, Agent, or Firm*—Peter Xiarhos

[57] ABSTRACT

A cable equalization resonant amplifier circuit for compensating for the signal-attenuation effects of a coaxial cable connected with the amplifier circuit and having a length of up to one-half mile. The gain of the amplifier circuit is matched with the attenuation characteristics of the coaxial cable over a wide range of frequencies by employing an LC resonant circuit with a Q of approximately 1 in the emitter circuit of an amplifying transistor. The gain for the amplifier circuit is established to match the attenuation characteristics of the coaxial cable at low frequencies by an RC circuit coupled with the amplifying transistor and the LC resonant circuit. The maximum or peak desired value of gain for the amplifier circuit at the resonant frequency of the LC resonant circuit is established by a resistor connected in series with the LC resonant circuit and a resistor in the collector circuit of the amplifying transistor.

8 Claims, 2 Drawing Figures

CABLE EQUALIZATION RESONANT AMPLIFIER CIRCUIT

The invention herein described was made in the course of a contract with the Department of the Army.

BACKGROUND OF THE INVENTION

The present invention relates to an amplifier circuit and, more particularly, to a cable equalization resonant amplifier circuit for compensating for the attenuation effects of a long section of coaxial cable, for example, a length of one-half mile.

It is often desired to transmit electrical signals over a coaxial cable to be used by circuitry or apparatus connected to the end of the coaxial cable. As is well known, the electrical signals are subject to attenuation by the coaxial cable with the result that either the signals must be appropriately altered prior to transmission over the coaxial cable or circuitry provided at the receive end of the coaxial cable for compensating for the attenuation effects of the coaxial cable. The present invention is directed to circuitry employed at the receive end of a coaxial cable for compensating for the signal-attenuation effects of the coaxial cable.

BRIEF SUMMARY OF THE INVENTION

In accordance with the present invention a cable equalization amplifier circuit is provided for compensating for the attenuation effects of a coaxial cable on signals transmitted over the coaxial cable. The cable equalization resonant amplifier circuit includes an amplifying transistor for amplifying signals over a predetermined frequency bandwidth. The transistor includes a base to which the signals transmitted over a coaxial cable are applied, a collector, and an emitter. A biasing means coupled with the amplifying transistor operates to cause the amplifying transistor to conduct and to amplify the signals applied to its base and to present the amplified signals at its collector.

The cable equalization amplifier circuit further includes a resonant circuit means and a matching circuit means. The resonant circuit means includes an inductive element and a capacitive element in the emitter circuit of the amplifying transistor with the inductive and capacitive elements having a predetermined value of Q and a predetermined resonant frequency. The matching circuit means is in the emitter circuit of the amplifying transistor and operates together with the resonant circuit means to match the gain of the amplifier circuit with the attenuation characteristics of the coaxial cable over the predetermined frequency bandwidth of the signals amplified by the amplifying transistor. The peak value of gain for the amplifier circuit at the resonant frequency of the inductive and capacitive elements of the resonant circuit means is established by a peak gain means in circuit with the inductive and capacitive elements of the resonant circuit means and in circuit with the collector of the amplifying transistor. An output circuit means coupled to the collector of the amplifying transistor operates to apply to an output signals amplified by the amplifying transistor at its collector in accordance with the gain characteristic established for the amplifier circuit by the resonant circuit means, the matching circuit means and the peak gain means.

BRIEF DESCRIPTION OF THE DRAWING

Various objects, features and advantages of a cable equalization resonant amplifier circuit in accordance with the present invention will be apparent from the following detailed discussion taken in conjunction with the accompanying drawing in which.

DETAILED DESCRIPTION OF THE INVENTION

Figure 1:
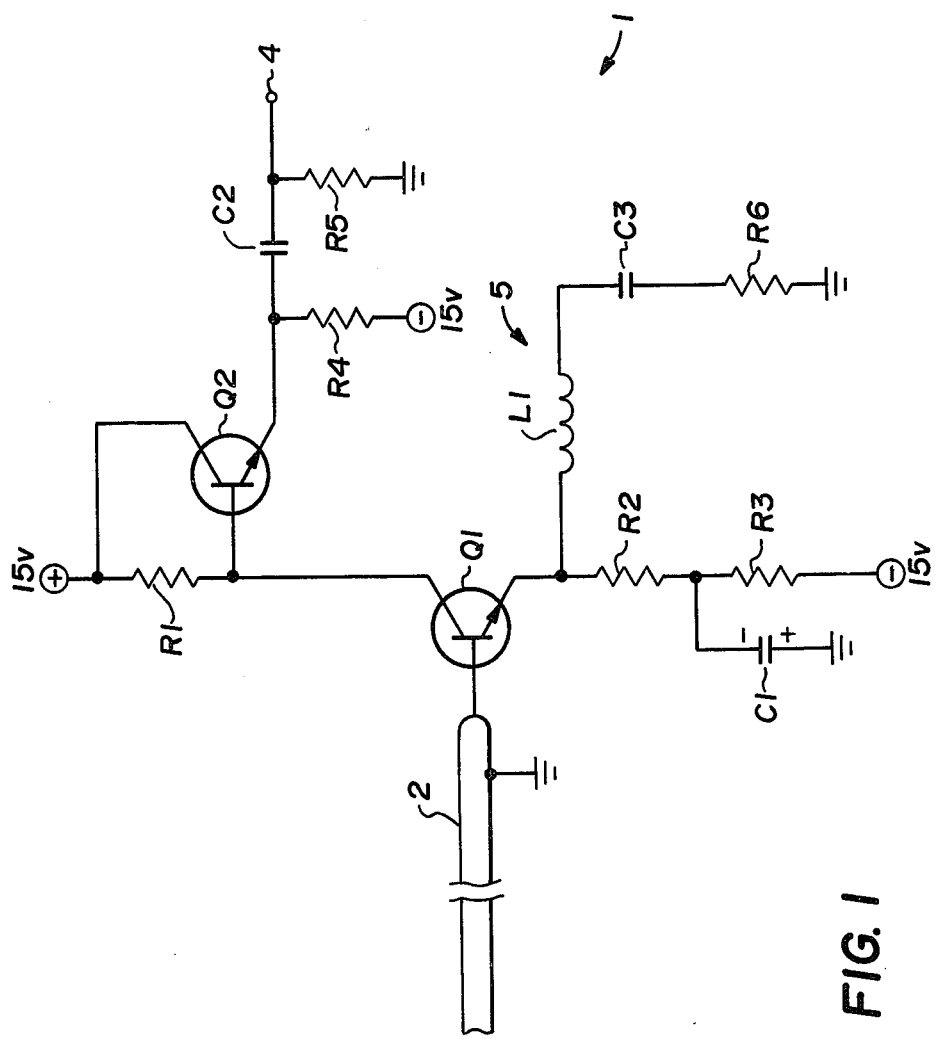
FIG. 1 is a schematic diagram of a cable equalization resonant amplifier circuit in accordance with the invention as employed in conjunction with a length of coaxial cable.

Referring now to FIG. 1, there is shown a cable equalization resonant amplifier circuit 1 as employed in conjunction with a length of coaxial cable 2 in accordance with the invention for compensating for the signal-attenuation effects of the coaxial cable 2. The amplifier circuit 1 includes an npn transistor Q1 to which electrical signals transmitted over the coaxial cable 2 are applied to be amplified by the amplifier circuit 1. By way of example, the electrical signals may have a frequency of 2.3 Mhz and include frequency components from dc to 2.3 Mhz. The transistor Q1 has its base coupled to the end of the coaxial cable 2, its collector coupled to a +15 volt source via a resistor R1, and its emitter coupled to a −15 volt source via a pair of series-connected resistors R2 and R3. The resistors R1, R2 and R3 are employed in conjunction with the +15 and −15 volt sources for biasing the transistor Q1 into its conducting state whereby the transistor Q1 is rendered operative to amplify the electrical signals received at its base and to provide the amplified signals at its collector. For optimum operation of the amplifier circuit 1, the resistor R1 is chosen to have the maximum value which will not cause appreciable gain roll-off of the Miller capacitance of the transistor Q1 and, at the same time, allow transistor biasing of several milliamperes for good high frequency operation.

A capacitor C1 is connected between the juncture of the above-mentioned resistors R2 and R3 and ground potential and serves, together with the resistor R2, to match the gain of the amplifier circuit 1 with the attenuation characteristics of the coaxial cable 2 at low frequencies, for example, below 100 Khz. The above-mentioned matching of the gain of the amplifier circuit 1 with the attenuation characteristics of the coaxial cable 2 at frequencies below 100 Khz is clearly shown in FIG. 2, a typical value of gain below 100 Khz being 5-6 db.

The amplifier circuit 1 as described above further includes a second npn transistor Q2 connected in an emitter follower configuration for coupling the collector output of the transistor Q1 to an output 4 and for stabilizing the gain of the amplifier circuit 1. The base of the transistor Q2 is connected to the juncture of the collector of the transistor Q1 and the resistor R1, the collector is connected to the +15 volt source, and the emitter is connected to one end of a resistor R4 and a capacitor C2. The other end of the resistor R4 is connected to a second −15 volt source and the other end of the capacitor C2 is connected to the output terminal 4.

A resistor R5 is connected between the output terminal 4 and ground potential. The resistor R4 is used in conjunction with the associated −15 volt source for biasing the transistor Q2 into its conducting state and the capacitor C2 is used to provide dc isolation at the output terminal 4. The output of the amplifier circuit 1 is a train of ac voltages which is presented across the resistor R5 for use by any suitable external circuit.

The matching of the gain of the amplifier circuit 1 with the attenuation characteristics of the coaxial cable 2 at frequencies above 100 Khz is accomplished principally by a resonant circuit 5 having a Q (resistance divided by reactance) of about 1. The resonant circuit 5 includes an inductor L1 and a capacitor C3 connected in series in the emitter circuit of the transistor Q1 and coupled to ground potential through a resistor R6. The values of the inductor L1 and the capacitor C3 are selected so that the resonant circuit 5 resonates, or peaks, at a frequency somewhat greater than the frequency of the input signal (2.3 Mhz) to be amplified by the amplifier circuit 1. The value of the inductor L1 is selected to have an impedance at resonance of Q times R6. The peak value of gain for the amplifier circuit 1, that is, at the resonant frequency of the resonant circuit 5, is determined by the value of the resistor R6 in conjunction with the value of the resistor R1. For optimum operation, the values of the reistors R1 and R6 are selected so that the ratio of the resistors R1 to R6 (R1/R6) is equal to or somewhat greater (to allow for predictable transistor losses) than the desired maximum or peak value of gain for the amplifier circuit 1 at the resonant frequency of the LC resonant circuit 5, for example, 20 db at 3 Mhz, as shown in FIG. 2.

Figure 2:
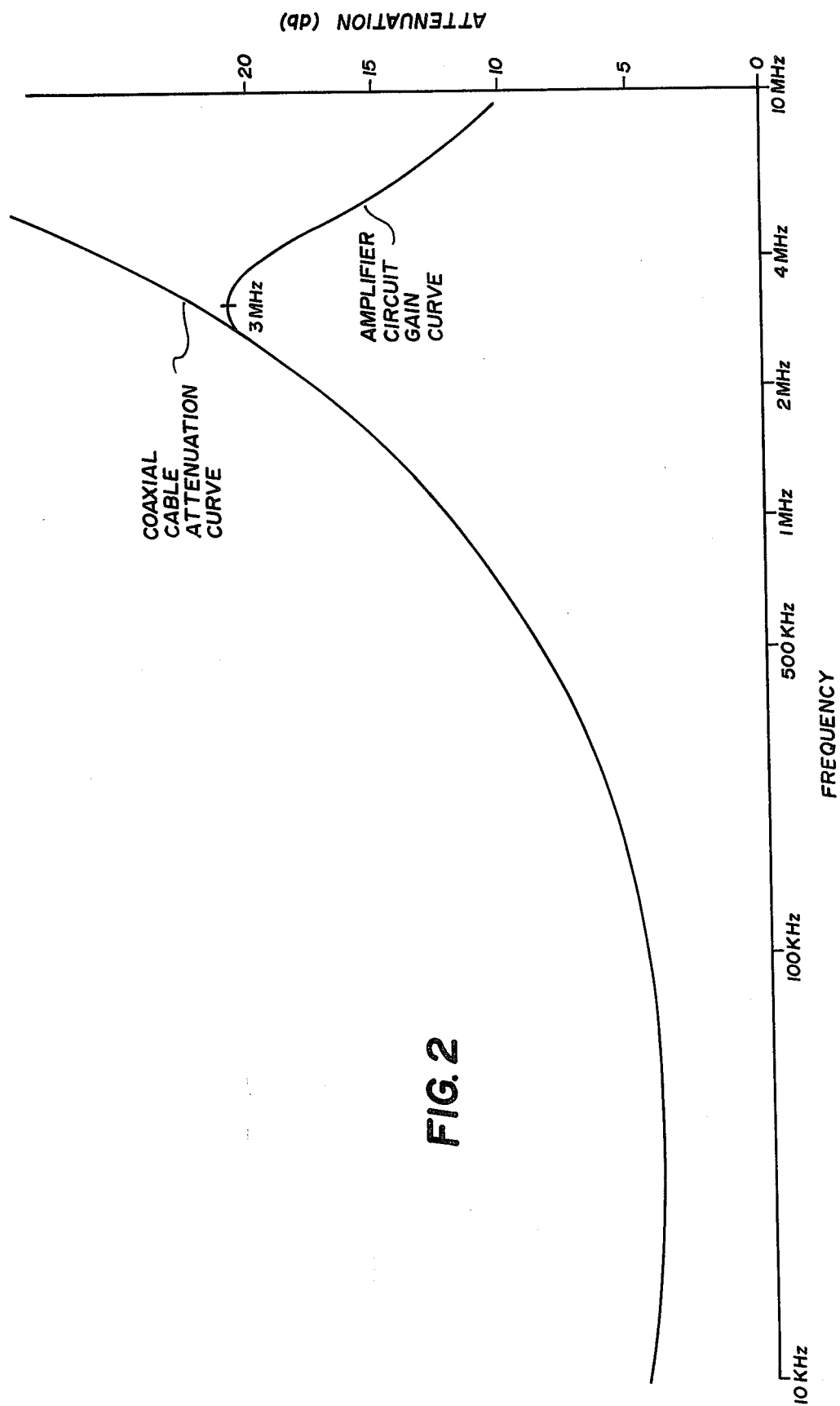
FIG. 2 illustrates a curve of attenuation versus frequency for the length of coaxial cable and a curve of gain versus frequency for the cable equalization resonant amplifier circuit corresponding to a particular frequency of electrical signals amplified by the amplifier circuit.

Some typical values of components of the amplifier circuit 1 which may be used with a section of coaxial cable (e.g., of a type CX-11230) of one-half mile for compensating for the attenuation effects of the coaxial cable are as follows:

R1 — 3.83 Kilohms
R2 — 1.96 Kilohms
R3 — 4.7 Kilohms
R4 — 4.7 Kilohms
R5 — 3.3 Kilohms
R6 — 301 ohms
C1 — 6.8 microfarads
C2 — 0.047 Kilohms
C3 — 120 picofards
L1 — 22 microhenries
Q1, Q2 — 2N918 or 2N2369A With the above values of components for the circuit 1, and with particular reference to FIG. 2, it will be seen that the gain of the amplifier circuit 1 matches very closely the attenuation characteristics of the coaxial cable up to the resonant frequency (approx. 3 Mhz) of the resonant circuit L1, C3. As the gain of the amplifier circuit 1 approaches its peak value, the impedance of the resonant circuit L1, C3 decreases and becomes zero at the resonant frequency and then increases in value beyond the resonant frequency. The gain of the amplifier circuit 1 accordingly drops off very rapidly beyond the resonant frequency, as clearly shown in FIG. 2. Since the resonant frequency of the amplifier circuit 1 is greater than the frequency of the electrical signals (e.g., 2.3 Mhz) transmitted over the coaxial cable, the digital signals may be suitably amplified with very low bit error rates within the frequency bandwidth and in accordance with the gain characteristic of the amplifier circuit 1 as shown in FIG. 2.

The amplifier circuit 1 as described above is intended to be used with a coaxial cable of a length of one-half mile. However, if two such amplifier circuits are connected in series, the two amplifier circuits may be used with a coaxial cable of a length of one mile. In this case, the cable attenuation and amplifier gain curves would be like those shown in FIG. 2 but would have ordinate attenuation values (db) twice those shown in FIG. 2.

While there has been described what is considered to be a preferred embodiment of the invention, it will be apparent to those skilled in the art that various changes and modifications may be made therein without departing from the invention as called for in the appended claims.

What is claimed is:

1. A cable equalization resonant amplifier circuit for compensating for the attenuation effects of a coaxial cable on signals transmitted over the coaxial cable, said cable equalization resonant amplifier circuit comprising:

an amplifying transistor for amplifying signals over a predetermined frequency bandwidth, said transistor having a base to which the signals transmitted over a coaxial cable are applied, a collector, and an emitter;

biasing means coupled with the amplifying transistor and operative to cause the amplifying transistor to conduct and to amplify the signals applied to its base and to present the amplified signals at its collector;

resonant circuit means including an inductive element and a capacitive element in the emitter circuit of the amplifying transistor, said inductive and capacitive elements having a predetermined value of Q and a predetermined resonant frequency;

matching circuit means in the emitter circuit of the amplifying transistor;

said resonant circuit means and matching circuit means being operative, and the Q of the resonant circuit elements being selected, so as to match the gain of the amplifier circuit with the attenuation characteristic of the coaxial cable over the predetermined frequency bandwidth of the signals amplified by the amplifying transistor;

peak gain means in circuit with the inductive and capacitive elements of the resonant circuit means and in circuit with the collector of the amplifying transistor and operative to establish the peak value of gain for the amplifier circuit at the resonant frequency of the inductive and capacitive elements; and output circuit means coupled to the collector of the amplifying transistor and operative to apply to an output signals amplified by the amplifying transistor at its collector in accordance with the gain characteristic established for the amplifier circuit by the resonant circuit means, the matching circuit means and the peak gain means.

2. A cable equalization resonant amplifier circuit in accordance with claim 1 wherein:

the matching circuit means includes a resistive element and a capacitive element.

3. A cable equalization resonant amplifier circuit in accordance with claim 2 wherein:

the peak gain means includes a resistive element in series with the inductive and capcitive elements of the resonant circuit means and a resistive element in the collector circuit of the amplifying transistor.

4. A cable equalization resonant amplifier circuit in accordance with claim 3 wherein:
   the inductive and capcitive elements of the resonant circuit means have a Q of about 1.

5. A cable equalization resonant amplifier circuit in accordance with claim 4 wherein:
   the output circuit means includes an emitter follower transistor circuit.

6. A cable equalization resonant amplifier circuit in accordance with claim 5 wherein:
   the resistive and capcitive elements of the matching circuit means are connected in parallel with the series combination of the inductive and capacitive elements of the resonant circuit means and the resistive element of the peak gain means in circuit with the said inductive and capacitive elements.

7. A cable equalization resonant amplifier circuit in accordance with claim 6 wherein:
   the biasing means includes:
      a first voltage source;
      a second voltage source;
      the resistive element of the peak gain means in the collector circuit of the amplifying transistor, said resistive element being coupled between the collector of the amplifying transistor and the first voltage source; and
      a resistive element connected between the emitter of the amplifying transistor and the second voltage source.

8. A cable equalization resonant amplifier circuit in accordance claim claim 7 wherein:
   the ratio of the value of the resistive element connected between the collector of the amplifying transistor and the first voltage source and the resistive element of the peak gain means in circuit with the resistive and capacitive elements of the resonant circuit means is at least equal to the maximum desired value of gain for the amplifier circuit at the resonant frequency of the inductive and capacitive elements of the resonant circuit means.

* * * * *